United States Patent
Lee et al.

[11] Patent Number: 6,157,329
[45] Date of Patent: Dec. 5, 2000

[54] BANDPASS SIGMA-DELTA MODULATOR EMPLOYING HIGH-Q RESONATOR FOR NARROWBAND NOISE SUPPRESSION

[75] Inventors: Hae-Seung Lee, Bedford, Mass.; John F. Bulzachelli, Scarsdale, N.Y.

[73] Assignee: Massachusetts Institute of Technology, Cambridge, Mass.

[21] Appl. No.: 09/153,191

[22] Filed: Sep. 15, 1998

Related U.S. Application Data

[60] Provisional application No. 60/058,888, Sep. 15, 1997.

[51] Int. Cl.[7] .................................................. H03M 1/00
[52] U.S. Cl. ........................................ 341/133; 341/143
[58] Field of Search .................................. 341/133, 143, 341/171

[56] References Cited

U.S. PATENT DOCUMENTS

| | | | |
|---|---|---|---|
| 5,140,324 | 8/1992 | Przybysz et al. | 341/133 |
| 5,166,647 | 11/1992 | Riebman | 33/107 |
| 5,341,136 | 8/1994 | Przybysz et al. | 341/133 |

*Primary Examiner*—Peguy JeanPierre
*Attorney, Agent, or Firm*—Samuels, Gauthier & Stevens, LLP

[57] ABSTRACT

The invention provides a superconducting bandpass sigma-delta modulator for use in analog-to-digital converters for converting an analog input signal to a digital output signal. The modulator includes an input unit, a sampling pulse generator unit, a quantizer unit, and a high Q resonator unit. The input unit is for receiving the analog input signal. The sampling pulse generator unit is for generating sampling pulses. The quantizer unit is coupled to the sampling pulse generator unit and to the input unit. The quantizer unit is for quantizing the input signal and producing an output signal representative of the analog input signal. The high Q resonator unit presents the quantizer unit with a low impedance at a center frequency of the input signal.

21 Claims, 5 Drawing Sheets

BANDPASS SIGMA-DELTA MODULATOR EMPLOYING HIGH-Q RESONATOR FOR NARROWBAND NOISE SUPPRESSION

PRIORITY INFORMATION

This application claims priority to U.S. Provisional Patent Application Ser. No. 60/058,888 filed on Sep. 15, 1997.

BACKGROUND OF THE INVENTION

This invention relates to analog-to-digital signal converters, and particularly relates to sigma-delta analog-to-digital converters.

Sigma-delta analog-to-digital converters permit high speed digital signal processing of analog signals. Such converters achieve high resolution through oversampling and noise-shaping. With the development of faster and more complex digital very large scale integrated circuit (VLSI) technology, digital signal processing has become increasingly important in a growing number of applications. Highly developed digital signal processing functions are now being incorporated into inexpensive consumer electronics to process signals at audio and video frequencies. Digital signal processing has advantages in precision, flexibility, and programmability when compared with traditional analog signal processing techniques. Digital signal processing may be able to provide these same advantages to signal processing at microwave frequencies, but the difficulty of digitizing such signals with available analog-to-digital converters typically precludes such processing. For example, a flash type semiconductor analog-to-digital converter is capable of digitizing signal frequencies above 1 GHz, but typically achieves less than 7 bits of resolution for such frequencies. This rather limited resolution is generally unacceptable for most radio systems which require a high dynamic range. There is a need for analog-to-digital converters that are able to digitize microwave signals with a high dynamic range.

Sigma-delta analog-to-digital converters are a class of analog-to-digital converters that achieve high resolution through over-sampling and noise shaping. Sigma-delta converters typically include an integrator, a single rough quantizer, a digital filter, and a feedback loop. The input analog signal is applied to the integrator. The quantizer operates at high speed to convert the output of the integrator to a single bit digital signal. The digital filter converts the high speed single bit output of the quantizer into a multi-bit digital output. The feedback loop includes the quantizer, a digital-to-analog converter and the integrator. The feedback in a delta-sigma converter integrates the error in the least significant digit thereby shifting any noise to higher frequencies above the fundamental frequency of the analog input signal. The effect of this is to shift most of the qauntization noise to frequencies above the bandwidth of the analog input signal.

Through this quantization noise shaping, a high signal to noise ratio is achieved in the baseband. The digital filter is a lowpass filter having a sharp cutoff above the bandwidth of the analog input signal. This digital filter eliminates the high frequency quantization noise and produces a high resolution multi-bit output at a reduced sampling rate, which is typically the Nyquist rate. An important advantage of delta-sigma analog-to-digital converters is that this resolution is achieved without the need to precisely match analog components with one another.

Semiconductor sigma-delta analog-to-digital converters were originally developed for digitizing baseband signals, such as audio signals. Since semiconductor sigma-delta analog-to-digital converters typically operate at clock frequencies below 100 MHz, and a large over-sampling ratio (i.e., the sampling rate to the Nyquist rate) is required to obtain high resolution, semiconductor sigma-delta analog-to-digital converters have traditionally been employed to digitize analog signals below 1 MHz. Bandpass sigma-delta modulators for analog-to-digital conversion have been proposed. A bandpass sigma-delta modulator is designed to suppress quantization noise over a narrow band of frequencies centered at an intermediate frequency, which may be a significant fraction of the clock frequency. Bandpass sigma-delta modulators may, therefore, digitize narrowband signals, such as radio frequency signals, with a high signal to noise ratio and a large dynamic range. Because the clock frequency of semiconductor bandpass sigma-delta converters is limited to about 100 MHz, the center frequency of the analog input signal is typically in the tens of MHz.

If microwave signals are to be processed by sigma-delta modulators for analog-to-digital converters, then multi-GHz clock speeds are needed. Superconducting technology, having clock rates over 100 GHz., provides promise for this application. Also, Josephson junctions, which naturally generate qauntized voltage pulses, have been found to provide excellent performance in sigma-delta modulators. Because the area of each pulse is equal to the magnetic flux quantum ($\Phi_0 = h/2e$), these pulses are known as single flux quantum (SFQ) pulses. The performance depends on the ability of the quantizer to produce an output pulse with an accurate and stable area.

Superconductive delta-sigma analog-to-digital converters typically employ a superconducting quantum interference device (SQUID) to generate pulses at frequencies of up to 30 GHz. U.S. Pat. No. 5,341,136 discloses a bandpass sigma-delta modulator for an analog to digital converter that includes, with reference to FIGS. 3 and 4 thereof, a feedback path 38 from the output to the pulse generator 40. This feedback path is disclosed to generate M feedback pulses for each SFQ pulse generated by the Josephson junction 34. Because Josephson devices have rather low gain, complex circuits using many Josephson junctions may be needed to implement a pulse generator with a significant value of M. U.S. Pat. Nos. 5,198,815 and 5,327,130 also disclose sigma-delta modulators for analog-to-digital converters that employ feedback pulse generators.

An active feedback loop will diminish circuit speed, particularly at high frequencies. Due to inevitable gain-bandwidth tradeoffs, the circuit delays added by feedback pulse generators such as disclosed in U.S. Pat. No. 5,341,136 may be substantially greater than the switching time of the Josephson junction quantizer. Consequently, the maximum clock frequency of the sigma-delta modulator will be limited significantly by the feedback loop. Such limitations in clock speed are particularly detrimental to the performance of a sigma-delta modulator for an analog-to-digital converter since the resolution is a function of the sampling rate to the Nyquist rate.

It is desirable to have a bandpass sigma-delta modulator whose clock speed is minimally limited, and permits digitization of high frequency signals with high resolution.

SUMMARY OF THE INVENTION

The invention provides a superconductive bandpass sigma-delta modulator for an analog-to-digital converter wherein the clock speed is limited only by the switching time of a single Josephson junction quantizer. In an embodiment, the invention provides a sigma-delta modulator for use in analog-to-digital converters for converting an analog input signal to a digital output signal. The modulator includes an input unit, a sampling pulse generator unit, a quantizer unit, and a high Q resonator unit. The input unit is for receiving the analog input signal. The sampling pulse generator unit is for generating sampling pulses. The quantizer unit is coupled to the sampling pulse generator unit and to the input unit. In certain embodiments, the input unit is connected to a resonator unit, and the resonator unit is connected to the quantizer unit. The quantizer unit is for quantizing the input signal and producing an output signal representative of the analog input signal. The high Q resonator unit presents the quantizer unit with a low impedance at a center frequency of the input signal. In further embodiments, the invention provides that the digital output signal may be provided at a clock frequency that is substantially equivalent to the switching frequency of a single Josephson junction.

BRIEF DESCRIPTION OF THE DRAWINGS

The following detailed description of the illustrated embodiments may be further understood with reference to the accompanying drawings in which.

DETAILED DESCRIPTION OF THE ILLUSTRATED EMBODIMENTS

Figure 1:
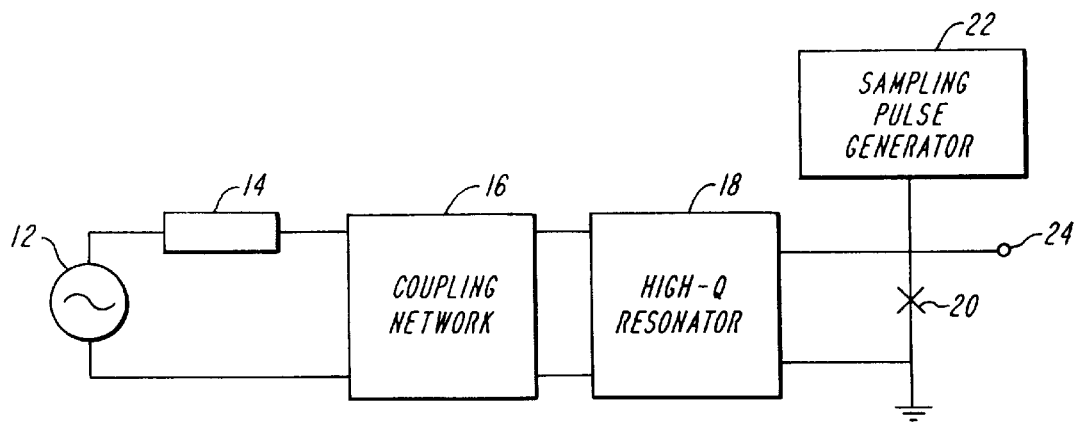
FIG. 1 shows a functional block diagram of a bandpass sigma-delta modulator of the an embodiment of the invention.

An analog input signal having a source impedance $Z_s$ may be coupled to a system of the invention 10 as shown in FIG. 1. The input is shown diagrammatically in FIGS. 1–7 as a source 12 and impedance unit 14. The input signal is coupled via a coupling network 16 to a high Q resonator 18, which is resonant at the center frequency of the analog input signal. The high Q resonator provides very low impedance and energy loss at the resonant frequency. The loading of the resonator 18 by the coupling network 16 and the source impedance 14 should not significantly decrease the Q of the resonator 18. In general, the coupling network 16 may comprise any combination of passive components, including resistors, capacitors, inductors, transformers, and transmission lines. If strong out-of-band interference is expected on the input signal, the coupling network may be designed to be a bandpass filter with the desired passband and stopband characteristics. Alternatively, the coupling network 16 may simply include a single capacitor.

Current induced by the high Q resonator 18 flows through a Josephson junction 20 to ground as shown in FIG. 1. The Josephson junction 20 is employed as a 1-bit quantizer. When the current through the Josephson junction 20 exceeds its critical current, the Josephson junction 20 generates a single flux quantum (SFQ) voltage pulse. The SFQ voltage pulse reduces the resonator current flowing through the Josephson junction 20. The pulses generated by the Josephson junction quantizer are synchronized to a clock frequency by a sampling pulse generator 22 which generates sampling pulses that add to the resonator current flowing through the Josephson junction 20. These sampling pulses also establish timing intervals that define the bits in the output code of the modulator. When a sampling pulse increases the current through the Josephson junction above its critical current, the Josephson junction generates an SFQ voltage pulse that represents a digital "ONE" in the output code at the modulator output 24. When a sampling pulse does not increase the current through the Josephson junction above its critical current, the Josephson junction does not generate an SFQ voltage pulse, the absence of which represents a digital "ZERO" in the output code at the modulator output 24. No feedback pulse generator is connected to the Josephson junction quantizer. In the present invention, the clock speed of the circuit is limited by the switching time of the Josephson junction quantizer only.

The high Q resonator of the invention is designed to shunt the Josephson junction with a minimum impedance at the resonant frequency. Near the resonant frequency, the low impedance shunting of the Josephson junction reduces the voltage noise across the Josephson junction. If this impedance is low enough, both quantization noise and thermal noise may be effectively suppressed over a narrow band of frequencies. A very low shunting impedance may be obtained if the Q of the resonator is large.

Figure 2:
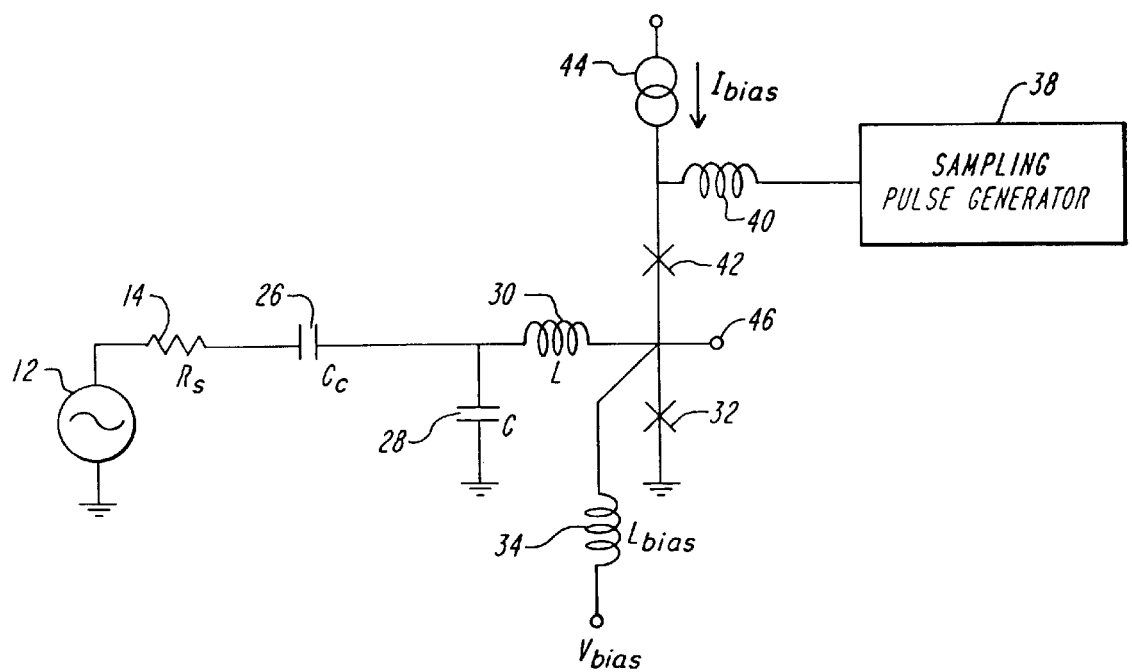
FIG. 2 shows a schematic circuit diagram of a bandpass sigma-delta modulator in accordance with an embodiment of the invention.

FIG. 2 shows a schematic diagram of a sigma-delta modulator circuit in accordance with an embodiment of the invention. In the circuit of FIG. 2, the coupling network simply includes a small coupling capacitor 26. The high Q resonator is implemented with a series LC circuit, including a capacitor 28 connected to ground and an inductor 30 connected to a Josephson junction 32. The circuit also includes a bias inductor 34 that is connected to a bias voltage 36 as shown in FIG. 2. Sampling pulses are generated by a sampling pulse generator 38 in communication with a sampling pulse inductor 40 and an auxiliary Josephson junction 42. A bias current source 44 also coupled to the auxiliary Josephson junction 42 as shown. In an exemplary embodiment, the coupling capacitor 26 may have a value of 0.1 pF, the inductor 30 may have a value of 25 pH, the capacitor 28 may have a value of 254 pF and the voltage bias inductor may have a value of 50 pH. The source impedance value may be 50 Ω. The resonant frequency of this circuit is 2 GHz, and the Q of the resonator exceeds 40,000 with the coupling capacitor connected between the source resistance and the resonator. The sampling input inductor 40 and the auxiliary Josephson junction 42 are coupled between the sampling pulse generator 38 and the Josephson junction quantizer 32 so that the sampling pulse may be in the form of an SFQ voltage pulse such as may be provided by a Josephson transmission line as know in the art. In this circuit configuration, the bias current through the auxiliary Josephson junction is adjusted so that the auxiliary Josephson junction generates an SFQ voltage pulse on sampling pulses for which the quantizer Josephson junction does not generate an SFQ voltage pulse. For sampling pulses for which the quantizer Josephson junction generates its own SFQ pulse, the auxiliary Josephson junction does not generate a voltage pulse. Since every sampling pulse in the form of an SFQ voltage pulse generates one SFQ voltage pulse across the series combination of the auxiliary Josephson junction and the quantizer Josephson junction, the circulating current through the sampling input inductor is reset to zero by the end of each sampling period.

The dc voltage source 36 that is connected to the Josephson junction quantizer 32 through the bias inductor 34, adjusts the threshold of the Josephson junction quantizer 32 so that the Josephson junction quantizer produces SFQ voltage pulses at an average rate proportional to the dc voltage source 36. If the dc voltage source 36 equals $\Phi_0 f_{clk}/2$, where $f_{clk}$ is the clock frequency of the sigma-delta modulator, the Josephson junction quantizer 32 will produce SFQ pulses at an average rate equal to half the clock frequency. This corresponds to an equal number of "ONE" bits as "ZERO" bits in the output code of the modulator at the output 46. As conventionally known, a dc voltage source equal to $\Phi_0 f_{clk}/2$, may be obtained by using a Josephson toggle flip-flop to generate a train of SFQ voltage pulses at half the clock frequency and then removing the ac components of the pulse train with a lowpass filter.

In other embodiments, a resistor may be employed in place of the capacitor 26 to couple the analog input signal to the LC resonator of FIG. 2. Unfortunately, however, the loss introduced by such a resistor may significantly reduce the Q of the resonator unless the value of the resistor is quite large. In order to maintain a high Q (e.g., greater than 40,000) a resistor value of about 12 KΩ may be needed. Such a large resistor may be difficult to implement in standard Josephson integrated circuit processes, and may decrease the input voltage sensitivity of the A/D converter by a significant factor (e.g., 16 times). A reduction of sensitivity is undesirable for a digital microwave receiver since such a receiver may often be required to detect weak radio signals. In contrast, capacitive or even inductive coupling does not introduce loss into the circuit, and permits a more favorable tradeoff between input sensitivity and resonator Q. It is preferred, therefore, that circuits of the invention include at least one reactive element (e.g., capacitor or inductor) in the coupling network.

Figure 3:
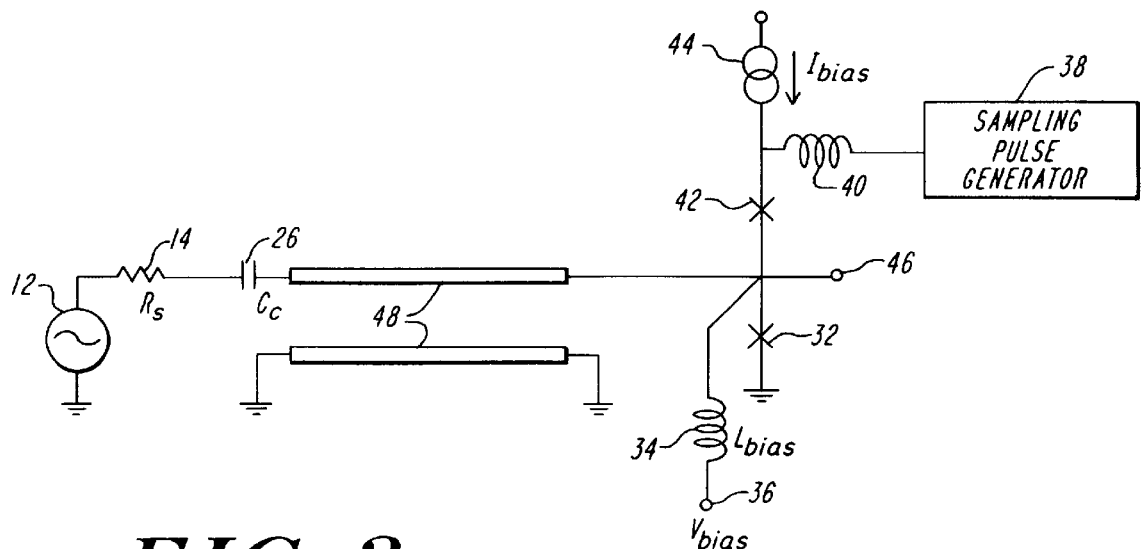
FIG. 3 shows a schematic circuit diagram of a bandpass sigma-delta modulator in accordance with another embodiment of the invention.

For input signals at microwave frequencies, resonators based on distributed circuits such as transmission lines, are sometimes preferred over circuits based on lumped elements such as inductors or capacitors. As shown in FIG. 3, a sigma-delta modulator circuit in accordance with another embodiment of the invention includes a resonator based on a transmission line 48. The circuit components other than those employed in the resonator, are the same as those employed in the example shown in FIG. 2, and bear the same reference numerals for clarity. The transmission line 48 is designed to be a quarter wavelength long at the resonant frequency, has a characteristic impedance $Z_0$ of 0.5 Ω, and provides a propagation delay $T_d$ of 100 ps. At the resonant frequency, the transmission line shunts the Joesphson junction quantizer with an impedance equal to $Z_0^2/Z_{load}$, where $Z_{load}$ is significantly greater than $Z_0$. The transmission line 48 will shunt the Josephson junction quantizer with an impedance significantly lower than $Z_0$ at the resonant frequency. In the example of FIG. 3, the length of the transmission line (which is chosen to be 100 ps) sets the resonant frequency at 2.5 GHz. For the component values for the components in common with the example of FIG. 2, the Q of the resonator exceeds 12,000 with the coupling capacitor connected between the source resistance and the transmission line. Because of higher-order modes on the transmission line resonator, the transmission line shunts the Josephson junction quantizer with a minimum impedance not only at the quarter wavelength frequency but at all odd multiples of the quarter wavelength frequency. For the example of FIG. 3, a minimum shunting impedance is found at 2.5 GHz, 7.5 GHz, 12.5 GHz etc. Since the low impedance shunting the Josephson junction suppresses both quantization noise and thermal noise near each of these frequencies, the bandpass sigma-delta modulator may be used to digitize signals in multiple frequency bands simultaneously, reducing the required circuitry in multi-channel digital receiver.

The loading of the Josephson junction quantizer by the transmission line may increase the switching time of the Josephson junction quantizer. Over time scales much shorter than the propagation delay of the transmission line, the characteristic impedance $Z_0$ of the transmission line may become significant as a resistive load. Since the switching time of a Josephson junction is inversely proportional to the resistance shunting the junction, the loading of the Josephson junction quantizer by $Z_0$ (which is smaller than typical Josephson junction impedances) may reduce the circuit speed considerably. Increasing $Z_0$ may improve the switching speed, but a higher value of $Z_0$ increases the impedance shunting the Josephson junction quantizer at all frequencies. This may be undesirable for suppressing quantization and thermal noise near the resonant frequency.

Figure 4:
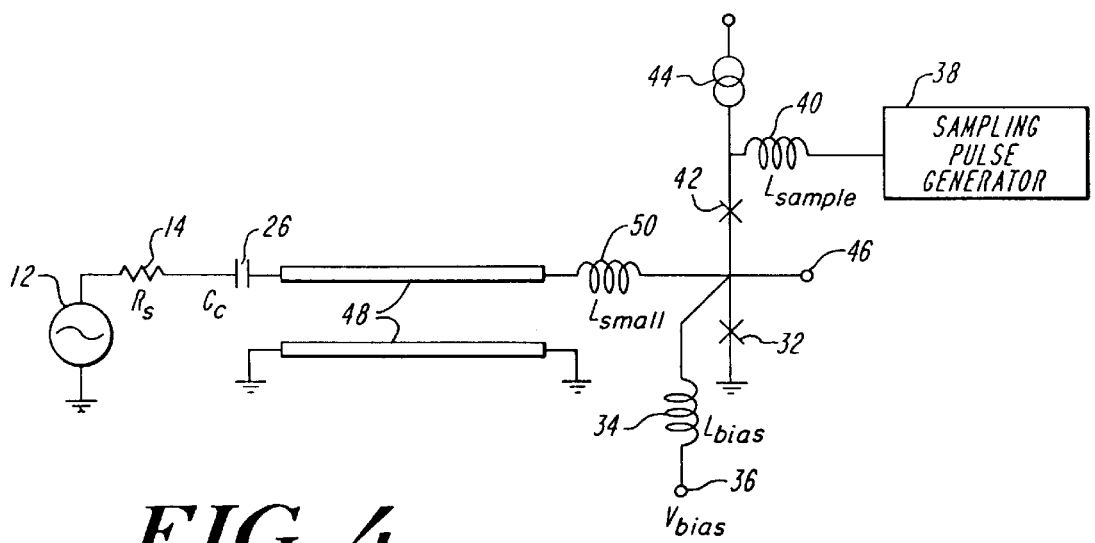
FIGS. 4 and 5 show schematic circuit diagrams of a bandpass sigma-delta modulators in accordance with further embodiments of the invention.

Another embodiment of a sigma-delta modulator of the invention is shown in FIG. 4. The components of FIG. 4 are the same as the associated components of FIG. 3 and bear the same reference numerals, except that FIG. 4 further includes a small inductor 50 that is coupled between the transmission line 48 and the Josephson junction quantizer 32. The inductor 50 may be, for example, 10 pH. At frequencies near the quarter wavelength frequency, the inductor has a small enough impedance that its only significant effect on the circuit is to reduce the resonant frequency from 2.5 GHz to 2.09 GHz. On time scales on the order of the Josephson junction switching time, the inductor has a high enough impedance to isolate the Josephson junction quantizer from undesirable loading by the transmission line 48. The addition of the small inductor to the circuit may, therefore significantly improve the switching speed, as well as alter the resonant frequency substantially. A bandpass sigma-delta modulator with an electrically tunable center frequency may be obtained by making this inductor electronically variable. Such tuning is desirable for constructing a digital radio receiver that is capable of receiving channels located at different frequency bands.

Figure 5:
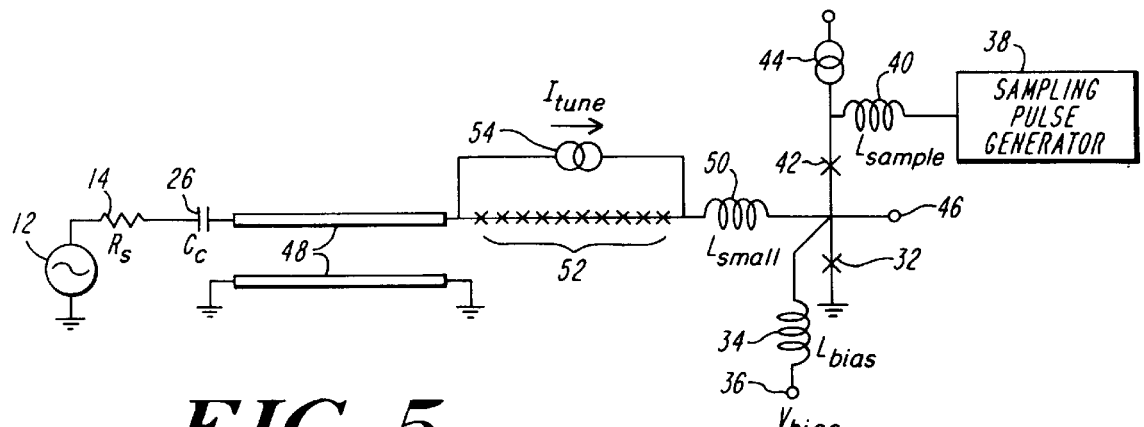

FIG. 5 shows another embodiment of a sigma-delta modulator circuit of the invention, again, wherein components similar to those shown in FIG. 3 are identified by the same reference numerals as those used in FIG. 3. The circuit of FIG. 5 further includes a series string 52 of Josephson junctions is employed as a variable inductor. A dc bias current $I_{tune}$ 54 is used to adjust the inductance $L_J$ of each Josephson junction in the series string 52 in accordance with the following formula wherein $I_C$ is the critical current of each Josephson junction in the series string 52.

$$L_J = \frac{\Phi_0}{2\pi I_c \sqrt{1 - (I_{tune}/I_c)^2}}$$

The value $I_C$ is chosen to be large enough that the ac currents flowing through the resonator do not switch the Josephson junctions in the series string out of the superconducting state. The total inductance of the series is equal to $L_J$ times the number of Josephson junctions in the series string 52. For the values of each component provided above, if the series string consists of 10 Josephson junctions with $I_C=1$ mA, and the bias current $I_{tune}$ is adjusted from 0 to 600 μA, then the resonant frequency will be changed from 2.115 GHz to 2.087 GHz, a 1.3% range. Larger tuning ranges may also be achieved by employing more Josephson junctions in the series string 52.

Figure 6:
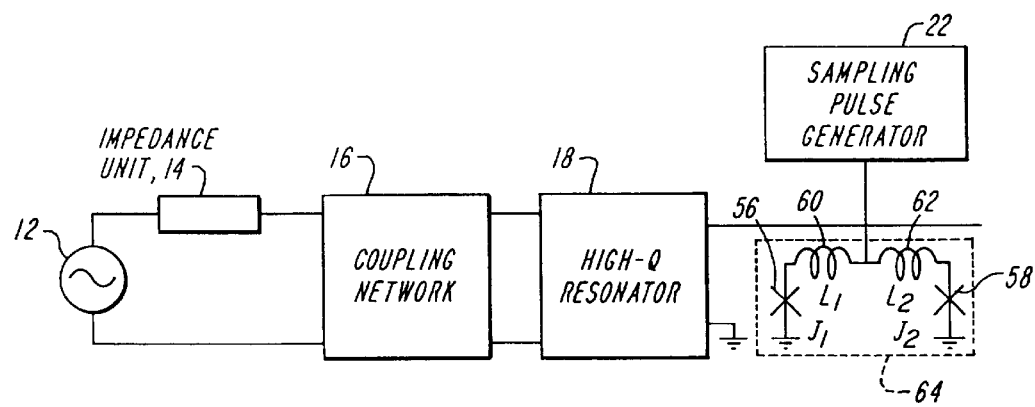
FIGS. 6 and 7 show functional block diagrams of bandpass sigma-delta modulators of further embodiments of the invention.

The Josephson junction employed as the single bit quantizer in the above disclosed embodiments, may be replaced by a multi-junction superconducting quantum interference device (SQUID) in further embodiments of the invention. As shown in FIG. 6, the loop formed by Josephson junctions 56 and 58 and inductors 60 and 62 together form an SQUID device 64. The critical current is a function of the device parameters of the Josephson junctions 56 and 58 (or $J_1$ and $J_2$ respectively), and the inductors 60 and 62 (or $L_1$ and $L_2$ respectively) as well as the magnetic flux coupled into the SQUID loop. As in the case of a single junction quantizer, the sampling pulse generator 22 produces sampling pulses that add to the resonator current flowing through the SQUID device. For sampling pulses that increase the current through the SQUID device above its critical current, junctions $J_1$ and $J_2$ both generate an SFQ voltage pulse. The SFQ voltage pulse that appears across the SQUID device reduces the resonator current through the SQUID and represents a digital "ONE" in the output code of the sigma-delta modulator. For sampling pulses that do not increase the current through the SQUID device above its critical current, neither the $J_1$ nor $J_2$ junctions will generate an SFQ voltage pulse. The absence of a voltage pulse across the SQUID device represents a digital "ZERO" in the output code of the modulator.

While the small inductances $L_1$ and $L_2$ in series with the junctions $J_1$ and $J_2$ may slightly alter the resonant frequency of the resonator, such effects may be readily compensated for by adjusting the circuit parameters of the resonator, e.g., by reducing L in the circuit of FIG. 2. Since the critical current of the SQUID is a function of the flux coupled into the SQUID loop, a magnetic control line may be used to adjust the threshold of the single-bit quantizer so that the sigma-delta modulator produces an output code with an equal number of "ONE" bits as "ZERO" bits. This will eliminate the need for direct current injection into the quantizer such as is accomplished by the bias inductor 34 in the circuits of FIGS. 2–5. The sampling pulse generator 22 drives the SQUID 64 symmetrically so that junctions J1 and J2 switch simultaneously. This maintains the same circuit dynamics (including maximum clock speed) as for a single junction quantizer.

Figure 7:
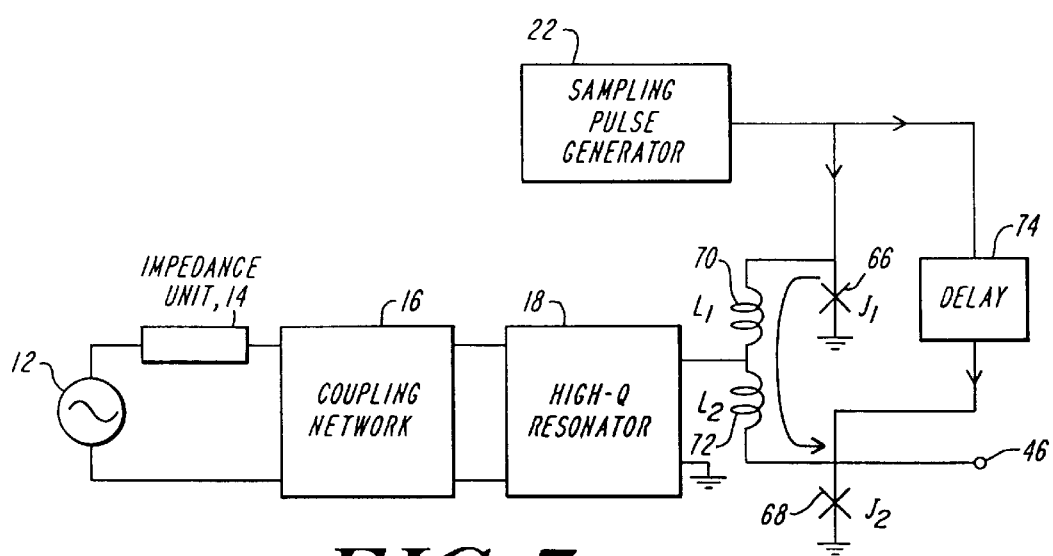

In a further embodiment of the invention, the SQUID may be triggered so that two Josephson junctions switch at slightly different times. As shown in FIG. 7, a sigma-delta modulator circuit of the invention may include a pair of Josephson junctions 66 and 68 ($J_1$ and $J_2$), a pair of inductors 70 and 72 ($L_1$ and $L_2$), and a delay unit 74 (as known in the art, e.g., a short Josephson junction transmission line). The use of a small delay unit 74 ensures that the sampling pulse is delivered to junction $J_1$ earlier than to junction $J_2$. Again, the sampling pulses add to the resonator current flowing through each arm of the SQUID loop formed by $J_1$, $J_2$, $L_1$ and $L_2$. For sampling pulses that increase the current through the junction $J_1$ above its critical current, junction $J_1$ generates an SFQ voltage pulse. Because junction $J_2$ has not yet generated a voltage pulse, an inductive voltage divider is formed between inductors $L_1$ and $L_2$, and a fraction ($L_2/(L_1+L_2)$) of an SFQ voltage pulse appears across the port of the resonator connected to the SQUID. This reduces the resonator current flowing through the SQUID. The generation of the SFQ pulse across the junction $J_1$ also sets up a circulating current flowing through $L_1$ and $L_2$ from junction $J_1$ toward junction $J_2$. Since this circulating current increases the current through junction $J_2$ to a level close to its critical current, junction $J_2$ generates an SFQ voltage pulse when triggered by the delayed sampling pulse. Once junction $J_2$ generates an SFQ pulse, the circulating current is reset to zero, and the remaining fraction ($L_1/(L_1+L_2)$) of the SFQ voltage pulse appears across the resonator port connected to the SQUID. This further reduces the resonator current flowing through the SQUID. For sampling pulses that do not increase the current through the junction $J_1$ above its critical current, junction $J_1$ does not generate a voltage pulse. Since no circulating current through the SQUID loop is created, the current through junction $J_2$ is small. Junction J2 does not generate an SFQ voltage pulse when the delayed sampling pulse arrives. Except for the small delay, the pulse patterns across junctions $J_1$ and $J_2$ are identical, and either may be used to represent the digital output of the sigma-delta modulator, which is provided across junction $J_2$ as shown in FIG. 7.

The shape and duration of the SFQ voltage pulse that appears across the resonator port connected to the SQUID may be altered by changing the time delay between the sampling pulses delivered to junctions $J_1$ and $J_2$, and by varying the ratio of $L_1$ to $L_2$. The flexibility in design provided by such pulse-shaping applications may be used to improve the signal to noise ratio (SNR) of a bandpass sigma-delta modulator. For some applications, the benefits provided by such additional flexibility in the design may outweigh the possible disadvantage of a modest reduction in maximum clock speed, which is due to the delay between the sampling pulses.

A simulation evaluation was performed with a JSIM system, a SPICE-like Josephson circuit simulation tool. The evaluation was performed on a circuit as shown in FIG. 4. The length of the circuit simulation time was chosen so that 1024 output bits of the sigma-delta modulator were produced after a transient startup period. The clock frequency was 20 GHz, and the Josephson junction qauntizer was biased through inductor $L_{bias}$ by a dc voltage source equal to $\Phi_0 f_{clk}/2 = 20.6785$ μV. Since the analog input signal was set to zero, the output of the modulator represents pure quantization noise.

Figure 8:
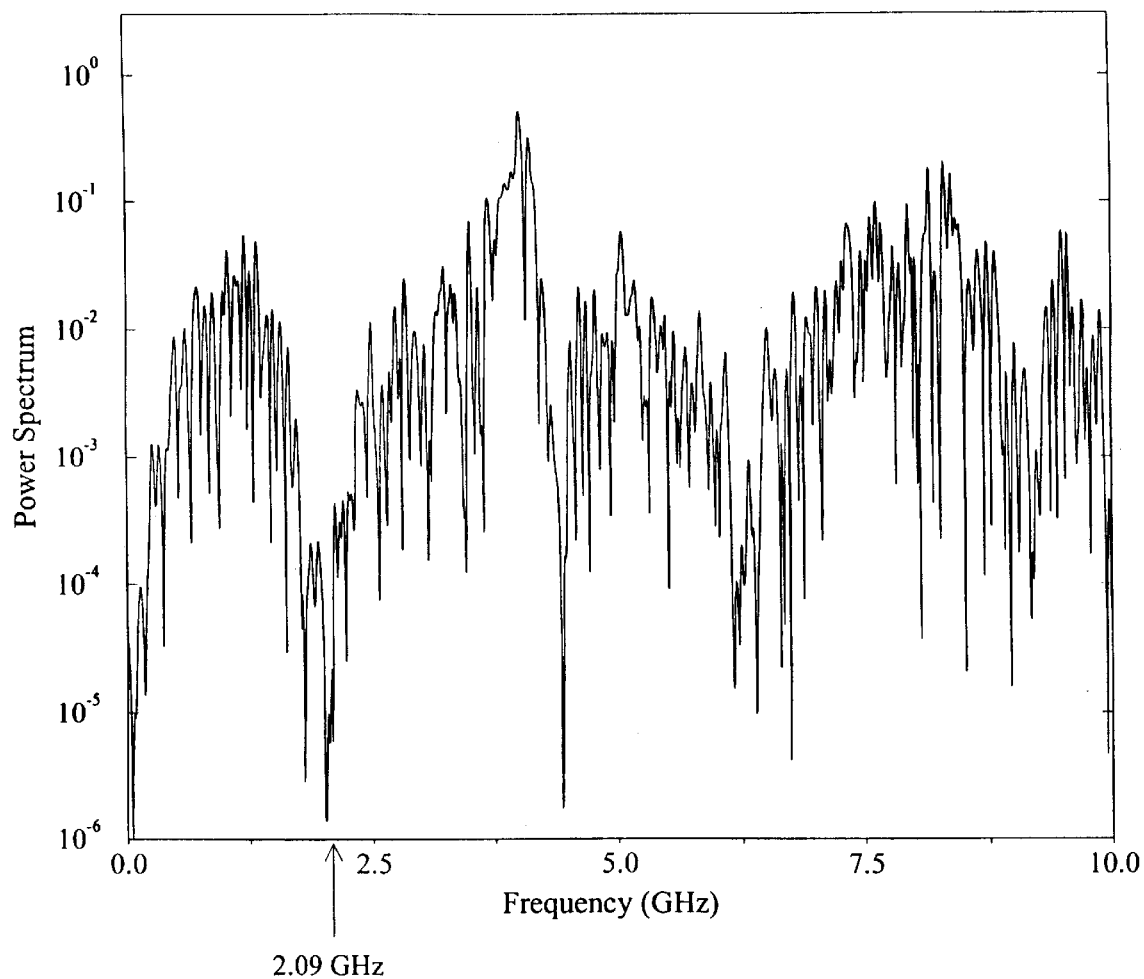
FIG. 8 shows a graph of the power spectrum versus frequency for a simulation of the performance of a circuit of the invention as shown in FIG. 4.

FIG. 8 shows a graph of a 1024 point FFT of the "ONE" bits and "ZERO" bits generated by the sigma-delta modulator shown in FIG. 4. For the exemplary component values provided above with reference to FIG. 4, the resonant frequency is about 2.09 GHz. Since the impedance shunting the Josephson junction quantizer is minimum at this resonant frequency, the Josephson junction quantizer is unable to generate voltage pulses at frequencies near 2.09 GHz. Consequently, as shown in FIG. 8, there is a minimum in the quantization noise power spectrum near 2.09 GHz. Integration of the quantization noise power spectrum over a 39 MHz bandwidth centered at this minimum gives a total in-band quantization noise level 59.2 dB below a full-scale input sinewave, roughly 9.5 effective bits of resolution. Since the depth of the quantization noise minimum near 2.09 GHz is limited by the frequency resolution of the 1024 point FFT, actual sigma-delta modulator performance is above the 9.5 bit level. In addition to the minimum in the quantization noise power near 2.09 GHz, there are minimums at other frequencies at which the Josephson junction quantizer is shunted with a small impedance. At low frequencies, inductor $L_{bias}$ has a small impedance, and the Josephson junction quantizer is effectively shorted to the dc voltage source. Consequently, there is a minimum in the quantization noise power near dc. Another minimum in the quantization noise power may be seen near 6.42 GHz, which corresponds to one of the higher-order transmission line modes discussed above. The JSIM simulation assumed that the transmission line was lossless, and only the loading of the resonator by the coupling capacitor 26 and the source impedance 14 limited the Q of the resonator. In practice, losses in the transmission line will limit the Q of the resonator.

Figure 9:
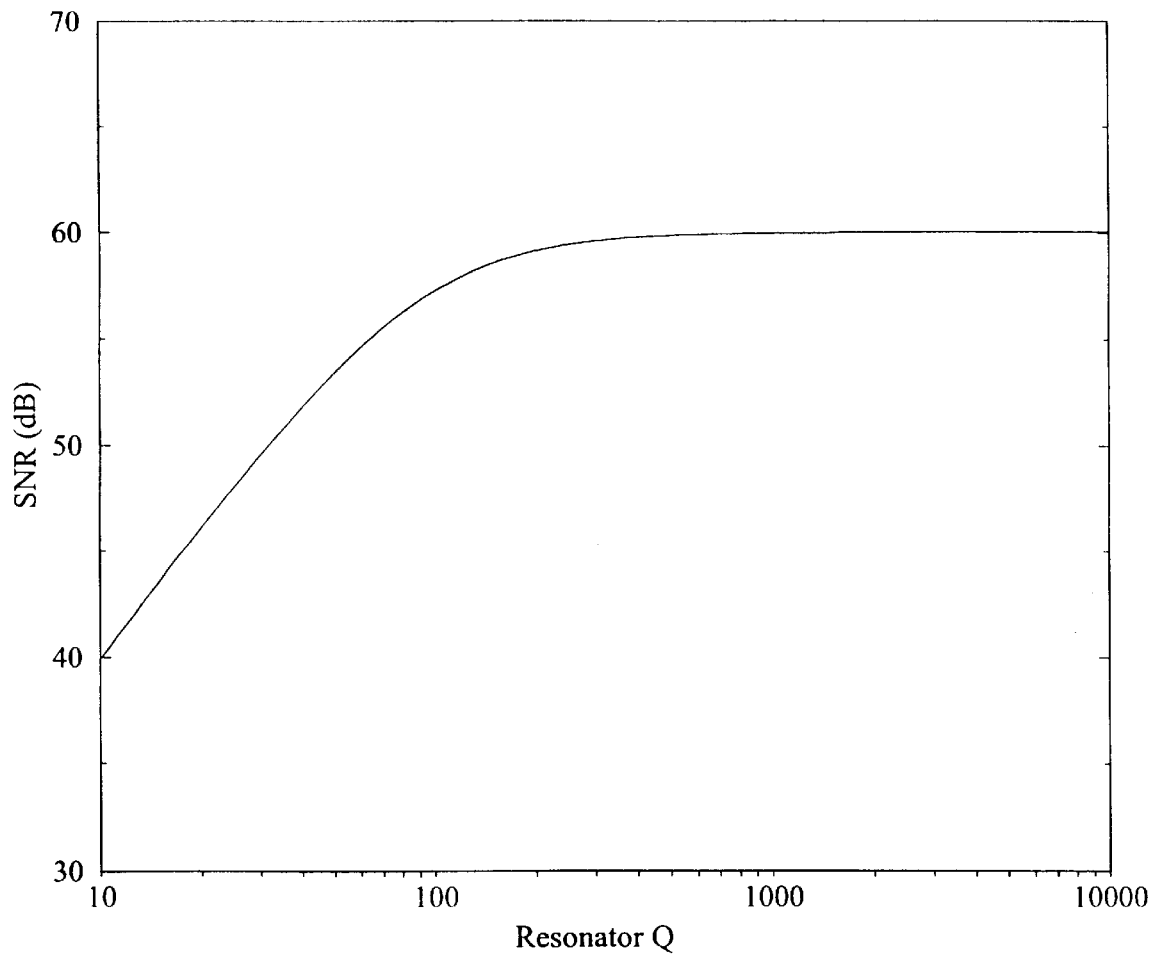
FIG. 9 shows a graph of the signal-to-noise ratio versus resonator Q for the performance of a circuit of the invention as shown in FIG. 4.

The signal to noise ratio in a 39 MHz bandwidth signal centered at 2.09 GHz is plotted as a function of the resonator Q in FIG. 9. In the generation of this graph, the quantizer was modeled as a source of additive white noise in accordance with standard sigma-delta modulation theory. The decrease in SNR for values of Q below 100 is clearly observed. For a Q of 1000, the SNR is within 0.1 dB of the ideal (lossless) case. Since superconducting transmission line resonators operating at GHz frequencies may exhibit values of Q above 5,000 the degradation in performance due to transmission line losses is expected to be negligible.

The bandpass sigma-delta modulator was not driven at its maximum clock speed in the JSIM simulation. Since the maximum clock frequency is limited only by the switching time of the single Josephson junction quantizer, circuit speed will be comparable to that of other circuit cells whose delay depends on the switching of one or two Josephson junctions. Josephson shift registers have been demonstrated up to 45 GHz. Since the resolution of the bandpass sigma-delta modulator of the present invention increases by 1.5 bits for each doubling of the sampling rate, an increase in the clock frequency from 20 GHz up to 40 GHz would improve the resolution of the circuit shown in FIG. 4. from 9.5 bits to 11 bits. This assumes that the signal bandwidth is held constant at 3.9 MHz. Even higher levels of performance are achievable if the circuit is implemented in a more advanced Josephson integrated circuit process, such as those using planarized niobium-trilayer Josephson junction technology as known in the art. With such technology, the clock frequency may be raised to 80 GHz, improving the resolution of the circuit of FIG. 4 up to 12.5 bits. Such resolution is nearly two orders of magnitude better than that of current semiconductor A/D converters.

Because of the small voltage levels at which the Josephson junction operates, the SNR of the bandpass sigma-delta modulator may be reduced by thermal noise. There are two major sources of thermal noise in the bandpass sigma-delta modulator of the present invention. The first is the dissipation of all the circuit elements coupling the analog input signal to the Josephson junction quantizer, including the source resistance and the losses in the coupling network and the resonator. According the Nyquist noise theorem, the spectral density of the mean-squared voltage noise appearing at the resonator port connected to the Josephson junction quantizer is $4kTR_r$, where $R_r$ is the real part of the impedance with which the resonator shunts the Josephson junction quantizer. Near the resonant frequency, the shunting impedance is much smaller than the impedance of the Josephson junction quantizer, and nearly all of this voltage noise appears across the Josephson junction quantizer. Since all of the losses limiting the Q of the resonator contribute to this voltage noise, there is a simple relationship between $R_r$ and Q. For values of Q much greater than 1, $R_r$ is inversely proportional to Q near the resonant frequency. Therefore, a high value of Q minimizes the effect of thermal noise. For example, if the Q of the resonator in the circuit shown in FIG. 4 equals 1000, and the temperature equals the liquid helium boiling point of 4.2 K, the root-mean-squared (RMS) voltage due to thermal noise in a 3.9 MHz bandwidth centered at 2.09 GHz is only 1.95 nV. This is 77.5 dB below a full scale input sine wave, assuming a clock frequency of 20 GHz. As described above, a JSIM simulation of the same circuit showed that the total in-band quantization noise level is 59.2 dB below a full-scale input sine wave for a clock frequency of 20 GHz. The in-band thermal noise due to dissipation in the circuit elements coupling the analog input signal to the Josephson junction quantizer is negligible compared with the in-band quantization noise.

Thermal noise such as Johnson noise associated with a damping resistor $R_d$ may also be created which shunts the Josephson junction quantizer. According to the Nyquist noise theorem, the spectral density of the mean-squared current noise of this resistor equals $4KT/R_d$. Near the resonant frequency, the resonator shunts the Josephson junction with an impedance $Z_r$ which is much smaller than the value of $R_d$. The current noise of the damping resistor produces a voltage noise across the Josephson junction with a mean-squared spectral density of $4kT|Z_r|^2/R_d$. Again with reference to the circuit of FIG. 4, if the Q of the resonator equals 1000, and the temperature equals 4.2 K, and $R_d$ equals 2Ω, then rms voltage due to the Johnson noise of the damping resistor in a 39 MHz bandwidth signal centered at 2.09 GHz is only 0.30 nV. This is 93.7 dB below a full-scale input sine wave, assuming a clock frequency of 20 GHz. Such noise is negligible compared with the in-band quantization noise.

The invention, therefore, provides a sigma-delta modulator circuit that is capable of digitizing signals of GHz frequencies with high resolution. Such circuits achieve high linearity without needing precise analog components. The quantum mechanical accuracy of the SFQ pulse ensures high precision at multi-GHz sampling rates. No feedback pulse generator is required to be connected to the Josephson junction quantizer. The elimination of a complex and slow feedback loop improves the practicability of the circuit and significantly increases the maximum clock frequency. A high Q resonator is employed to suppress in-band quantization noise and in-band thermal noise. Implementing such high Q resonators is possible using Josephson technology, in part, because of the low losses of superconductors. Since the maximum clock frequency is limited only by the switching time of a single Josephson junction quantizer, the bandpass sigma-delta modulator of the present invention is capable of very high sampling rates, potentially over 100 GHz.

Those skilled in the art will appreciate that modifications and variations may be made to the above disclosed embodiments without departing from the spirit and scope of the invention.

What is claimed is:

1. A superconducting bandpass sigma-delta modulator for use in analog-to-digital converters for converting an analog input signal to a digital output signal, said modulator comprising:

input means for receiving the analog input signal;

sampling pulse generator means for generating sampling pulses;

quantizer means coupled to said sampling pulse generator means and to said input means for quantizing the input signal and producing an output signal representative of the analog input signal; and high Q resonator means for presenting the quantizer means with a low impedance at a center frequency of the input signal.

2. A superconducting bandpass sigma-delta modulator as claimed in claim 1, wherein said high Q resonator means includes an inductor and a capacitor.

3. A superconducting bandpass sigma-delta modulator as claimed in claim 1, wherein said high Q resonator means includes a transmission line having a characteristic impedance and an inherent propagation delay.

4. A superconducting bandpass sigma-delta modulator as claimed in claim 3, wherein said high Q resonator means includes an inductor coupled between said transmission line and said quantizer means.

5. A superconducting bandpass sigma-delta modulator as claimed in claim 1, wherein said high Q resonator means includes a variable inductor.

6. A superconducting bandpass sigma-delta modulator as claimed in claim 5, wherein said variable inductor includes a string series of Josephson junctions.

7. A superconducting bandpass sigma-delta modulator as claimed in claim 1, wherein said sampling pulse generator means includes a Josephson junction.

8. A superconducting bandpass sigma-delta modulator as claimed in claim 1, wherein said quantizer means includes a Josephson junction.

9. A superconducting bandpass sigma-delta modulator as claimed in claim 1, wherein said quantizer means includes a Josephson junction and a voltage bias inductor.

10. A superconducting bandpass sigma-delta modulator as claimed in claim 1, wherein said quantizer means includes a superconducting quantum interference device.

11. A superconducting bandpass sigma-delta modulator as claimed in claim 10, wherein said superconducting quantum interference device includes a pair of Josephson junctions coupled in parallel to ground.

12. A superconducting bandpass sigma-delta modulator as claimed in claim 11, wherein said superconducting quantum interference device includes a pair of inductors coupled to said Josephson junctions.

13. A superconducting bandpass sigma-delta modulator as claimed in claim 12, wherein said superconducting quantum interference device includes delay means in communication with said sampling pulse generator means and a pair of Josephson junctions, said delay means for providing that a sampling pulse is delivered to one of said Josephson junctions prior to being delivered to the other of said pair of Josephson junctions.

14. A superconducting bandpass sigma-delta modulator for use in analog-to-digital converters for converting an analog input signal to a digital output signal, said modulator comprising:

input means for receiving the analog input signal;

high Q resonator means coupled to said input means;

sampling pulse generator means for generating sampling pulses;

quantizer means coupled to said sampling pulse generator means and to said resonator means for quantizing the input signal and producing an output signal representative of the analog input signal, said resonator means for presenting said quantizer means with a low impedance at a resonant frequency, wherein said digital output signal is provided at a clock frequency that is substantially equivalent to the switching frequency of a single Josephson junction.

15. A superconducting bandpass sigma-delta modulator as claimed in claim 14, wherein said quantizer means includes a Josephson junction.

16. A superconducting bandpass sigma-delta modulator as claimed in claim 14, wherein said quantizer means includes a Josephson junction and a voltage bias inductor.

17. A superconducting bandpass sigma-delta modulator as claimed in claim 14, wherein said quantizer means includes a superconducting quantum interference device.

18. A superconducting bandpass sigma-delta modulator as claimed in claim 17, wherein said superconducting quantum interference device includes a pair of Josephson junctions coupled in parallel to ground.

19. A superconducting bandpass sigma-delta modulator as claimed in claim 18, wherein said superconducting quantum interference device includes a pair of inductors coupled to said Josephson junctions.

20. A superconducting bandpass sigma-delta modulator as claimed in claim 18, wherein said superconducting quantum interference device includes delay means in communication with said sampling pulse generator means and a pair of Josephson junctions, said delay means for providing that a sampling pulse is delivered to one of said Josephson junctions prior to being delivered to the other of said pair of Josephson junctions.

21. A superconducting bandpass sigma-delta modulator for use in analog-to-digital converters for converting an analog input signal to a digital output signal, said modulator comprising:

coupling means for receiving the analog input signal and producing a coupled signal;

high Q resonator means coupled to said coupling means for producing a resonant signal;

sampling pulse generator means for generating sampling pulses;

quantizer means coupled to said sampling pulse generator means and to said high Q resonator means for quantizing the resonant signal and producing an output signal representative of the analog input signal, wherein said digital output signal may be provided at a clock frequency that is substantially equivalent to the switching frequency of a single Josephson junction, said high Q resonator means further being provided to shunt the quantizer means with a low impedance and low fractional energy loss per cycle at a center frequency of the input signal.

* * * * *